United States Patent
Chang et al.

(10) Patent No.: US 8,592,321 B2
(45) Date of Patent: Nov. 26, 2013

(54) METHOD FOR FABRICATING AN APERTURE

(75) Inventors: Feng-Yi Chang, Tainan (TW); Yi-Po Lin, Tainan (TW); Jiunn-Hsiung Liao, Tainan (TW); Shang-Yuan Tsai, Kaohsiung (TW); Chih-Wen Feng, Tainan (TW); Shui-Yen Lu, Hsinchu County (TW); Ching-Pin Hsu, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/156,319

(22) Filed: Jun. 8, 2011

(65) Prior Publication Data

US 2012/0315748 A1 Dec. 13, 2012

(51) Int. Cl.
*H01L 21/46* (2006.01)
*H01L 21/302* (2006.01)

(52) U.S. Cl.
USPC .................................. 438/736; 257/E21.305

(58) Field of Classification Search
USPC ........ 438/695, 711, 717, 736; 216/41, 49, 51, 216/72
See application file for complete search history.

(56) References Cited

U.S. PATENT DOCUMENTS

| | | | |
|---|---|---|---|
| 6,465,294 B1 * | 10/2002 | Tsai et al. | 438/217 |
| 7,432,210 B2 | 10/2008 | Wang | |
| 7,718,081 B2 | 5/2010 | Liu | |
| 8,298,935 B2 * | 10/2012 | Chen et al. | 438/636 |
| 2003/0119307 A1 * | 6/2003 | Bekiaris et al. | 438/638 |
| 2005/0167839 A1 * | 8/2005 | Wetzel et al. | 257/758 |
| 2007/0249171 A1 | 10/2007 | Sung | |
| 2008/0102553 A1 | 5/2008 | Shin | |
| 2008/0286979 A1 | 11/2008 | Shin | |
| 2009/0191711 A1 * | 7/2009 | Rui et al. | 438/695 |
| 2009/0212010 A1 * | 8/2009 | Wang et al. | 216/47 |
| 2009/0239375 A1 * | 9/2009 | Riess et al. | 438/640 |
| 2009/0314743 A1 * | 12/2009 | Ma | 216/51 |
| 2010/0178771 A1 * | 7/2010 | Oh et al. | 438/700 |
| 2010/0203733 A1 * | 8/2010 | Kanegae et al. | 438/694 |
| 2010/0317195 A1 | 12/2010 | Feng | |

* cited by examiner

*Primary Examiner* — William D Coleman
*Assistant Examiner* — Christine Enad
(74) *Attorney, Agent, or Firm* — Winston Hsu; Scott Margo

(57) ABSTRACT

A method for fabricating an aperture is disclosed. The method includes the steps of: forming a hard mask containing carbon on a surface of a semiconductor substrate; and using a non-oxygen element containing gas to perform a first etching process for forming a first aperture in the hard mask.

14 Claims, 6 Drawing Sheets

METHOD FOR FABRICATING AN APERTURE

BACKGROUND OF THE INVENTION

1. Field of the Invention

The invention relates to a method for fabricating an aperture, and more particularly, to a method for fabricating an aperture in a hard mask while preventing the occurrence of bowing profile on sidewall of the hard mask where the aperture is being formed.

2. Description of the Prior Art

The trend to micro-miniaturization, or the ability to fabricate semiconductor devices with features smaller than 0.1 micrometers, has presented difficulties when attempting to form narrow diameter, deep (high aspect ratio) contact holes in a dielectric layer, to expose underlying conductive regions.

Conventional approach of fabricating contact holes typically involves first providing a semiconductor substrate with a plurality of semiconductor devices thereon, in which the semiconductor devices includes MOS transistors or resistors. At least a dielectric layer and a hard mask are then formed on the semiconductor substrate to cover the semiconductor devices, and a patterned resist is used to perform a series of pattern transfer processes to form a contact hole in the hard mask and the dielectric layer.

However, conventional method typically uses an oxygen containing gas for performing the aforementioned pattern transfer process, which causes severe indentation with respect to the central region of the sidewall and ultimately produces a bowing profile. Unfortunately, metal deposited in the contact hole thereafter is likely to seal the entrance of the hole before filling the expanding bowing portion of the contact hole. As a result, a seam is formed relative to the central region of the deposited metal, which degrades the electrical connection of the device and affects the overall performance.

SUMMARY OF THE INVENTION

It is an objective of the present invention to provide a method for resolving the issue of bowing profile in the contact hole fabricated by conventional technique.

According to a preferred embodiment of the present invention, a method for fabricating an aperture is disclosed. The method includes the steps of: forming a hard mask containing carbon on a surface of a semiconductor substrate; and using a non-oxygen element containing gas to perform a first etching process for forming a first aperture in the hard mask.

Another aspect of the present invention provides a method for fabricating an aperture. The method includes the steps of: forming a hard mask and a dielectric anti-reflective coating (DARC) on a semiconductor substrate; forming a first bottom anti-reflective coating (BARC) on the DARC; forming a first aperture in the first BARC and portion of the DARC; forming a second BARC on the DARC and filling the first aperture; forming a second aperture in the second BARC and portion of the DARC; and using non-oxygen element containing gas to perform an etching process to transfer the first aperture and the second aperture to the hard mask for forming a plurality of third apertures.

Another aspect of the present invention provides a method for fabricating an aperture, which includes the steps of: forming a hard mask and a dielectric anti-reflective coating (DARC) on a semiconductor substrate; forming a first bottom anti-reflective coating (BARC) on the DARC; etching the first BARC, the DARC, and the hard mask for forming a first aperture in the hard mask; forming a second BARC on the DARC to fill the first aperture; and etching the second BARC, the DARC, and the hard mask to form a second aperture in the hard mask, wherein the step of etching the hard mask comprises using a non-oxygen element containing gas.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
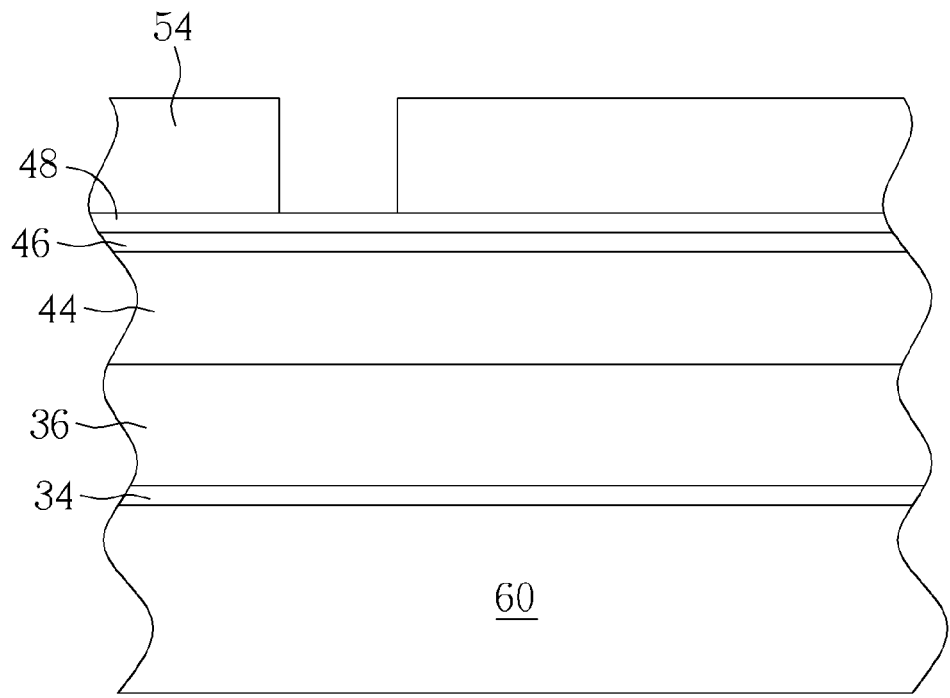
FIGS. 1-3 illustrate a method for fabricating an aperture according to a preferred embodiment of the present invention.
Figure 2:
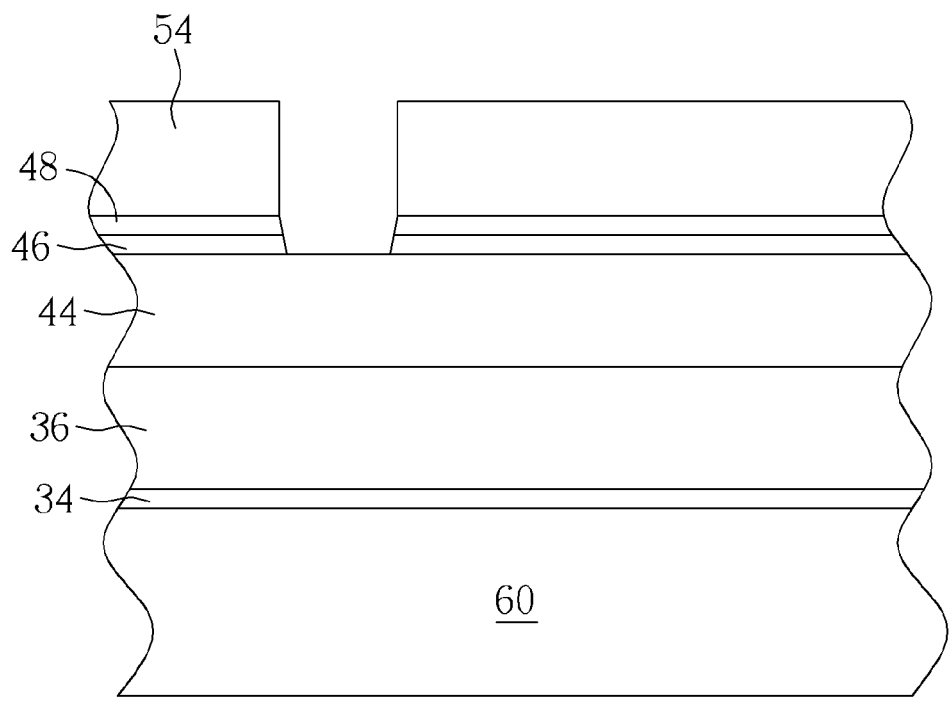
Figure 3:
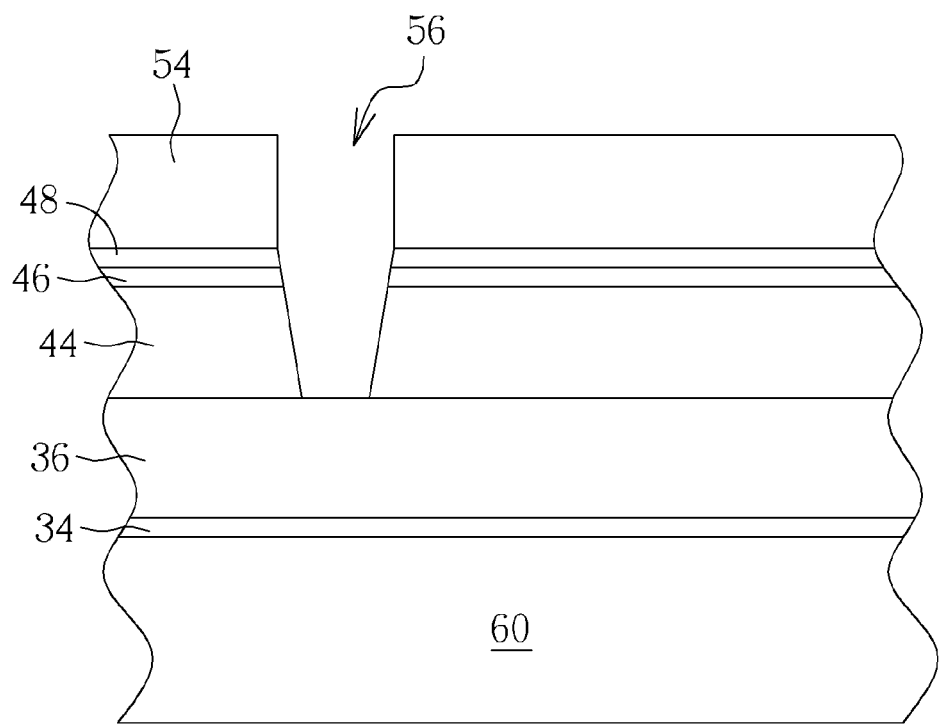

Referring to FIGS. 1-3, FIGS. 1-3 illustrate a method for fabricating an aperture according to a preferred embodiment of the present invention. As shown in FIG. 2, a semiconductor substrate 60, such as a substrate composed of monocrystalline silicon, gallium arsenide (GaAs) or other known semiconductor material is provided. A standard metal-oxide semiconductor (MOS) transistor fabrication is performed to form at least one MOS transistor (not shown) or other semiconductor devices on the semiconductor substrate 60. The MOS transistor could be a PMOS transistor, a NMOS transistor, or a CMOS transistor, and the MOS transistor could also include typical transistor structures including a gate structure, a spacer, a lightly doped drain, a source/drain regions and/or salicides. The gate structure could be a polysilicon gate or a metal gate fabricating from a high-k first or high-k last processes. As these processes are well known to those skilled in the art, the details of which are omitted herein for sake of brevity.

A contact etch stop layer (CESL) 34 composed of nitrides is then deposited on the MOS transistors, in which the depth of the contact etch stop layer 34 is about 850 Angstroms. The contact etch stop layer 34 could be formed selectively, and the contact etch stop layer 34 could be formed to provide stress to the device underneath. For instance, the contact etch stop layer 34 could be a SiC layer providing tensile stress for NMOS transistors, or a SiN layer providing compressive stress for PMOS transistors. If a STI or non-transistor device is disposed underneath, the contact etch stop layer could be a composite contact etch stop layer consisting of tensile CESL and compressive CESL, and a buffer layer is further inserted between the tensile CESL and the compressive CESL.

An interlayer dielectric layer (ILD) 36 is formed on surface of the contact etch stop layer 34. In this embodiment, the interlayer dielectric layer 36 is preferably composed of three layers, including a dielectric layer deposited by sub-atmospheric pressure chemical vapor deposition (SACVD), a phosphosilicate glass (PSG) layer, and a tetraethylorthosilicate (TEOS) layer. The depth of the entire interlayer dielectric layer 36 is a few thousand Angstroms, and preferably at approximately 3150 Angstroms; the depth of the dielectric layer is around several thousands of Angstroms, and preferably at 250 Angstroms; the depth of the PSG layer is between 1000 Angstroms to 3000 Angstroms, and preferably at 1900 Angstroms; and the depth of the TEOS layer is between 100 Angstroms to 2000 Angstroms, and preferably at 1000 Angstroms. In addition to be a composite material layer, the interlayer dielectric layer 36 could also be a single material layer, and in addition to the aforementioned materials, the interlayer dielectric layer 36 could also include undoped silicate glass (USG), borophosphosilicate glass (BPSG), low-k dielectric material such as porous dielectric material, SiC, SiON, or combination thereof.

Next, a hard mask 44 is formed on surface of the interlayer dielectric layer 36. According to a preferred embodiment of the present invention, the hard mask 44 is composed of carbon containing material such as amorphous carbon, and is preferably selected from an advanced pattern film (APF) fabricated by Applied Materials Inc., in which the depth of the hard mask 44 is between 1000 Angstroms to 5000 Angstroms, and preferably at 2000 Angstroms. A dielectric anti-reflective coating (DARC) 46 and a bottom anti-reflective coating (BARC) 48 are then deposited on surface of the hard mask 44. In this embodiment, the DARC 46 is preferably composed of a silicon oxynitride (SiON) layer and an oxide layer, in which the depth of the DARC 46 is approximately 250 Angstroms, and the depth of the BARC 48 is approximately 1020 Angstroms. The DARC 46 and the BARC 48 are formed selectively, and in addition to inorganic materials, these two layers 46 and 48 could also be composed of organic materials by spin-coating process.

A plurality of pattern transfer processes is then performed on the above stacked film to form an aperture penetrating the BARC 48, the DARC 46, the hard mask 44, the interlayer dielectric layer 36, and the contact etch stop layer 34 to expose the MOS transistor underneath, such as the source/drain region of the MOS transistor. For example, a patterned resist 54 adapted for the wavelength of approximately 193 nm is formed on the aforementioned stacked film to expose a portion of the upper surface of the BARC 48, in which the depth of the patterned resist 54 is approximately 1800 Angstroms. A descum process is performed thereafter by using a gas containing CO and $O_2$ to remove excessive particles produced from exposure and development process.

Next, as shown in FIG. 2, the patterned resist 54 is used as mask to perform a pattern transfer process on the BARC 48. Preferably, an etching gas containing $CF_4$ and $CH_2F_2$ is utilized to remove a portion of the BARC 48 and the DARC 46 for transferring the aperture pattern of the patterned resist 54 to the BARC 48 and the DARC 46 and exposing the hard mask 44 underneath.

As shown in FIG. 3, another pattern transfer is performed by using the patterned resist 54 as mask and non-oxygen element containing gas as etching gas to partially remove the hard mask 44. This transfers the aperture in the BARC 48 and the DARC 46 to the hard mask 44 for forming a patterned hard mask. In this embodiment, the non-oxygen element containing etching gas utilized is selected from a group consisting of $H_2$, $N_2$, He, $NH_3$, $CH_4$, and $C_2H_4$. It should also be noted that as the non-oxygen element containing gas is used to pattern the hard mask 44, the patterned resist 54 and the BARC 48 above the hard mask 44 are also removed simultaneously to form an aperture 56 in the hard mask 44.

Next, the patterned hard mask 44 is used as mask to perform an etching process on the ILD 36 and the CESL 34, such as by using a gas containing $C_4F_6$, O, and Ar to partially remove the ILD 36 thereby transferring the aperture 56 to the ILD 36 and the CESL 34. This completes the fabrication of an aperture according to a preferred embodiment of the present invention.

As current fabrication process typically cannot obtain a desirable aperture pattern from one single pattern transfer process due to smaller pitch, a two exposure and two development (2P2E) approach is often employed to form desirable aperture patterns. Next, referring to FIGS. 4-5, FIGS. 4-5 illustrate perspective views of applying the aforementioned method for forming apertures to a current 2P2E process according to an embodiment of the present invention.

Figure 4:
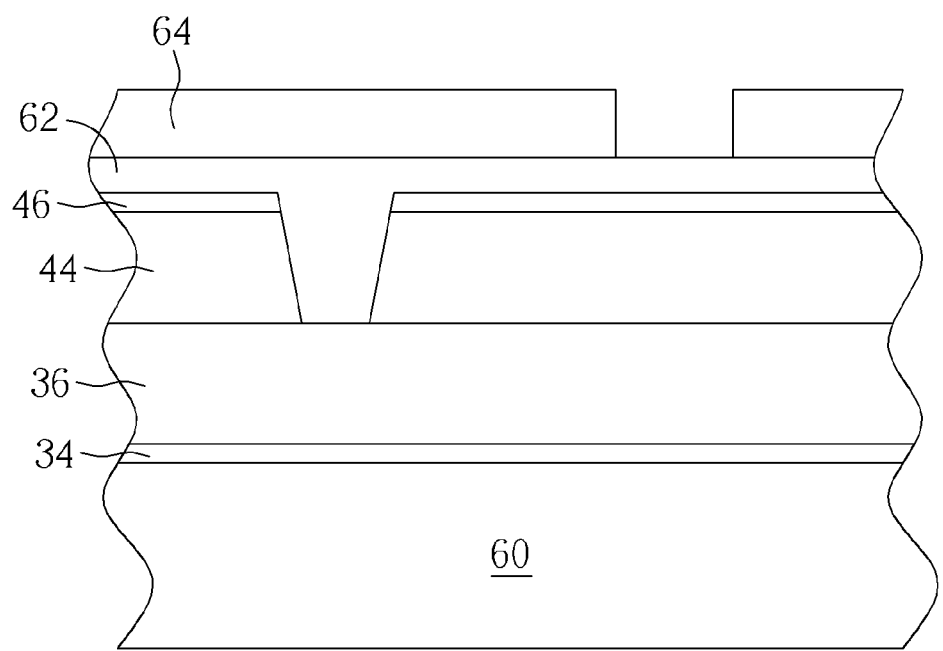
FIGS. 4-5 illustrate a method for fabricating an aperture according to an embodiment of the present invention.

As shown in FIG. 4, after the aperture 56 is formed in the hard mask 44 from FIG. 3, another BARC 62 and a patterned resist 64 could be formed on the DARC 46, in which the BARC 62 preferably fills the aperture 56 entirely.

Figure 5:
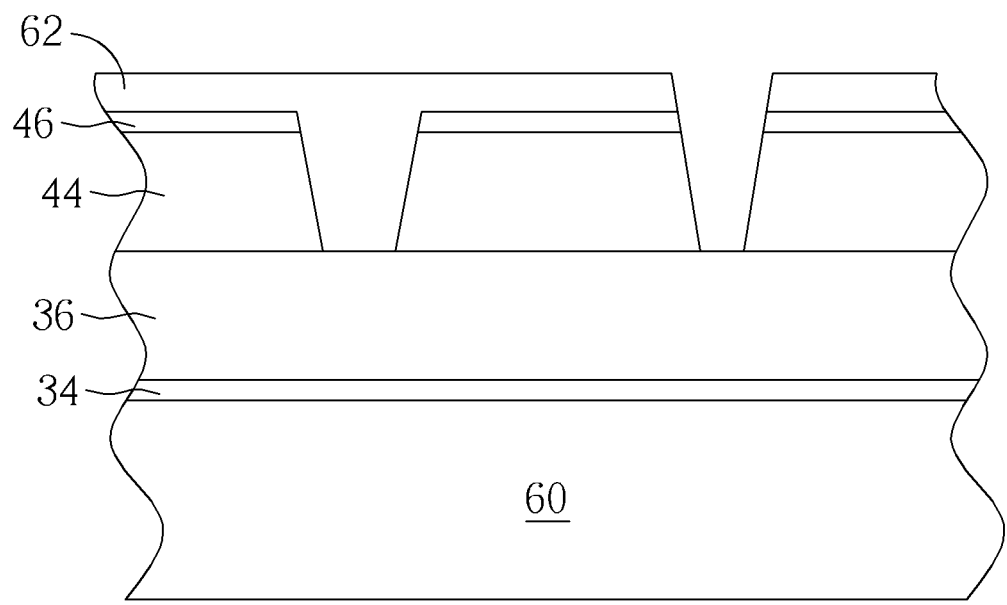

As shown in FIG. 5, an etching process is performed by first using the patterned resist 64 as mask to partially remove the BARC 62 and the DARC 46 for exposing the hard mask 44 underneath. Next, another etching process is carried out by using non-oxygen element containing gas to etch the hard mask 44. This transfers the aperture of the BARC 62 and the DARC 46 to the hard mask 44 for forming a patterned hard mask. After stripping the patterned resist 62, the BARC 62 and the DARC 46, an etching process is carried out by using the patterned hard mask 44 directly as mask to partially remove the ILD 36 and the CESL 34.

Figure 6:
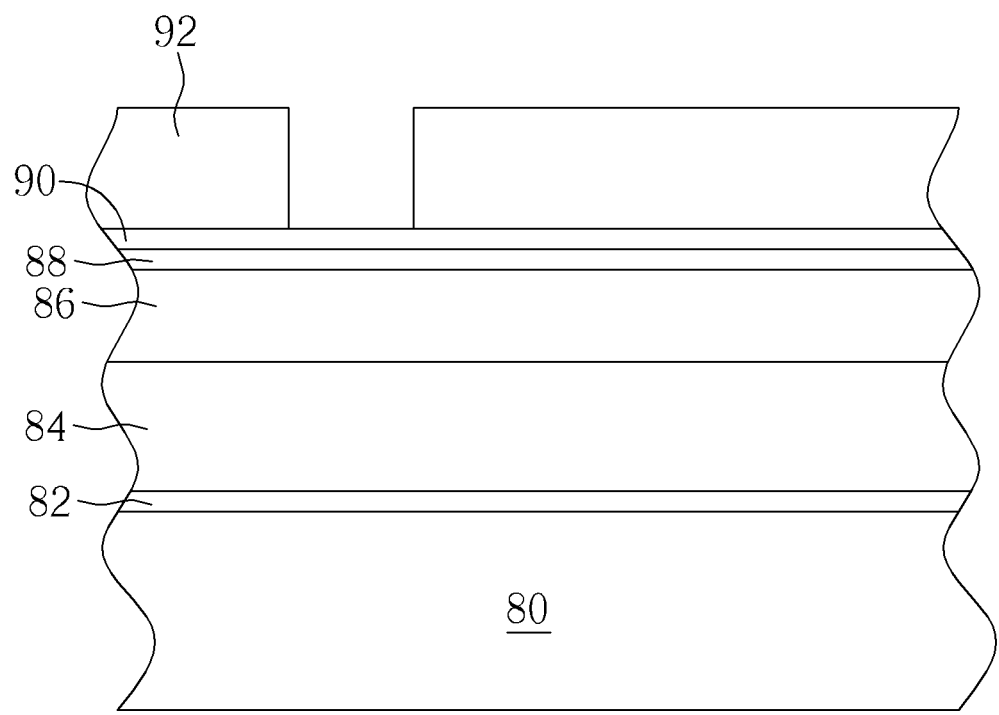
FIGS. 6-11 illustrate a method for fabricating an aperture according to an embodiment of the present invention.

Referring to FIGS. 6-11, which illustrate perspective views of applying the aforementioned method of forming apertures to a 2P2E process according to another embodiment of the present invention. As shown in FIG. 6, a semiconductor substrate 80 is provided, in which at least one semiconductor device (not shown) is formed on the semiconductor substrate 80. The semiconductor device could be a MOS transistor, such as a PMOS transistor, an NMOS transistor, or a CMOS transistor, or devices of other types.

A CESL 82, an ILD 84, a hard mask 86, a DARC 88, a first BARC 90, and a patterned resist 92 are sequentially formed on the semiconductor device. The materials of the CESL 82, the ILD 84, the hard mask 86, the DARC 88, and the first BARC 90 could be analogous to the ones disclosed in the aforementioned embodiments, and the details of which are omitted herein for the sake of brevity.

Figure 7:
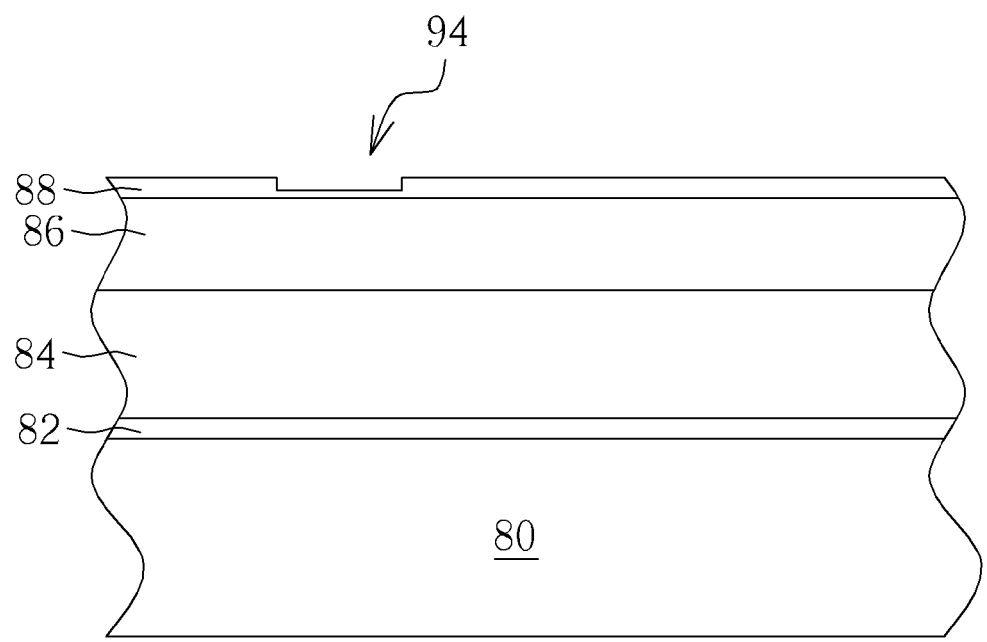

Next, a pattern transfer process is performed by using the patterned resist 92 as mask and using an etching gas containing $CF_4$ and $CH_2F_2$ to partially remove the first BARC 90 and a portion of the DARC 88. In this embodiment, this etching process preferably removes only half the thickness of the DARC 88 while not exposing any of the hard mask 86 underneath. After stripping the patterned resist 92 and the remaining first BARC 90, as shown in FIG. 7, a first aperture 94 is formed in the DARC 88.

Figure 8:
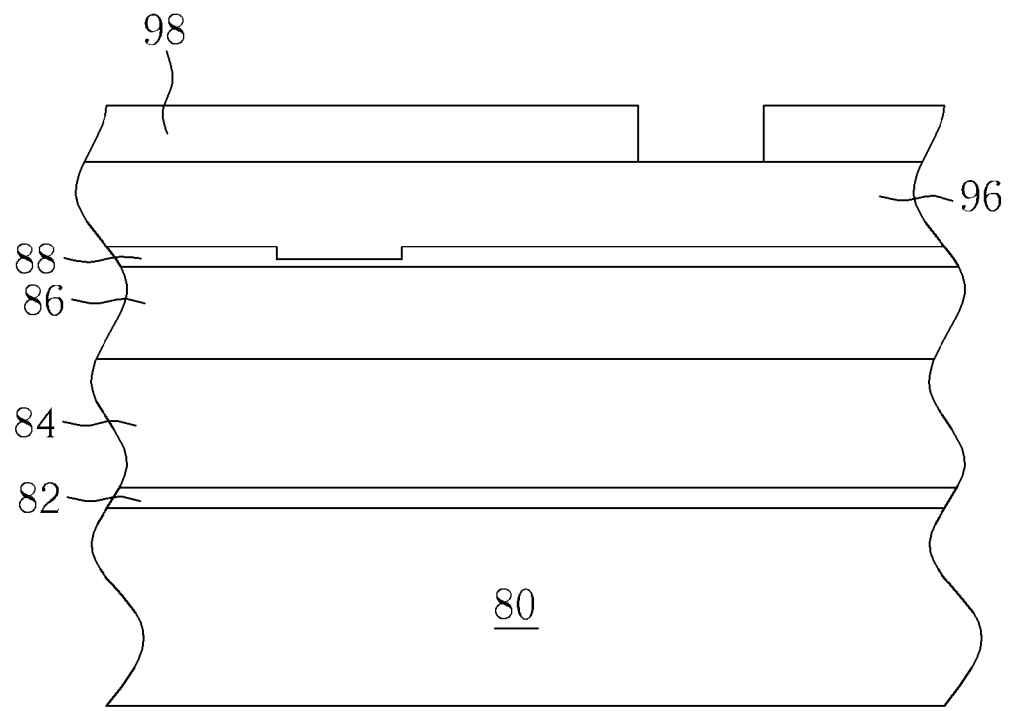
Figure 9:
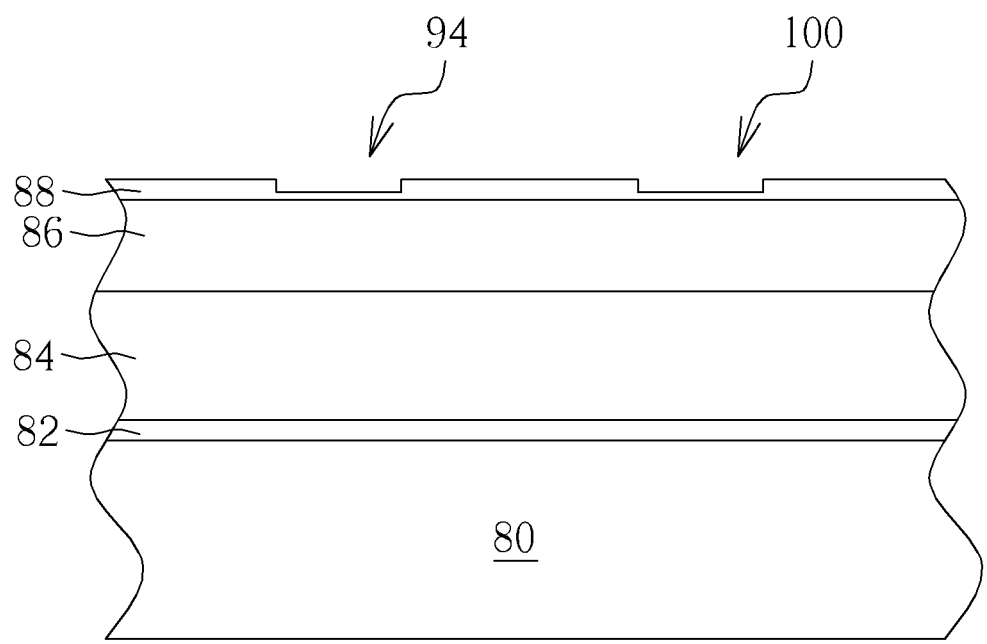

As shown in FIG. 8, a second BARC 96 and a patterned resist 98 are sequentially formed on the DARC 88, in which the second BARC 96 preferably fills the first aperture 94 in the DARC 88. Next, as shown in FIG. 9, another pattern transfer process is performed by using the patterned resist 98 as mask to partially remove the second BARC 90 and half the thickness of the DARC 88 while not exposing any of the hard mask 86 underneath. After stripping the patterned resist 98 and the remaining second BARC 96, a second aperture 100 is formed in the DARC 88.

Figure 10:
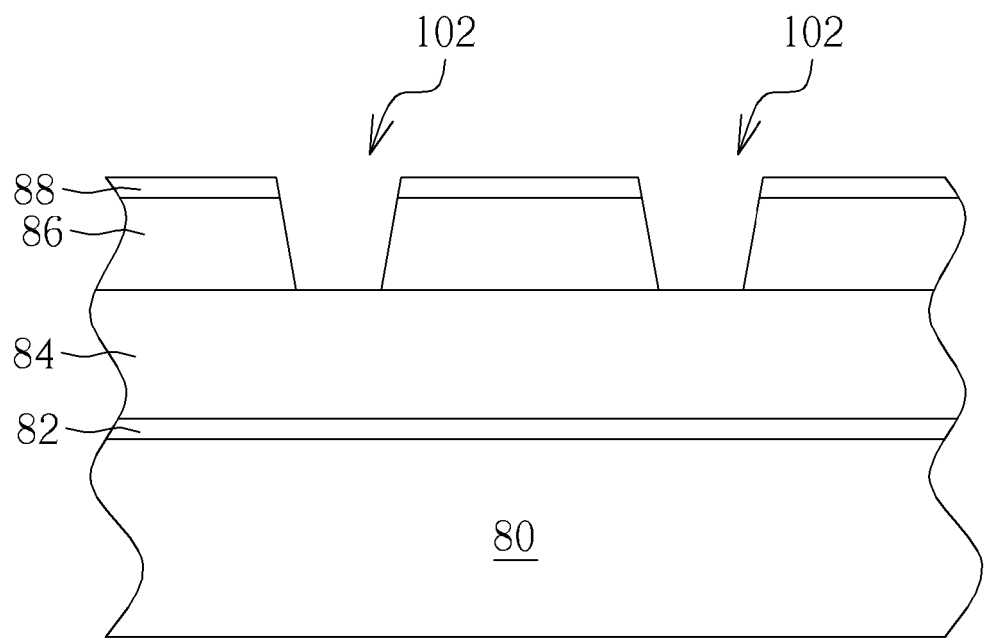

As shown in FIG. 10, an etching process is first carried to remove the remaining DARC 88 under the first aperture 94 and the second aperture 100 to expose the hard mask 86, and another etching process is performed by using the remaining DARC 88 as mask to form a plurality of third apertures 102 in the hard mask 66. Similar to the aforementioned embodiment for etching the hard mask 86, this embodiment also uses a non-oxygen element containing gas to partially remove the hard mask 86 for forming the third apertures 102, in which the non-oxygen element gas utilized is selected from a group consisting of $H_2$, $N_2$, He, $NH_3$, $CH_4$, and $C_2H_4$.

Figure 11:
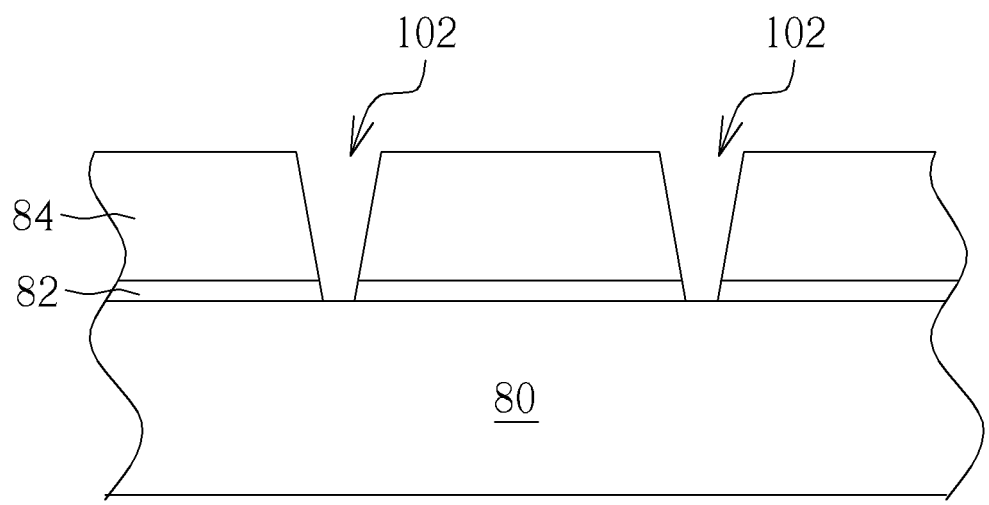

Next, as shown in FIG. 11, an etching process is conducted by using the remaining DARC 88 as mask, or first removing the remaining DARC 88 and using the patterned hard mask 86 as mask to transfer the third apertures 102 in the hard mask 86 to the ILD 86 and the CESL 82. This completes the fabrication of apertures according to another embodiment of the present invention. It should be noted that the apertures formed through the aforementioned embodiments is not limited to circular to apertures, but could also be formed along the horizontal axis of the gate to form rectangular slot openings, and after metals are filled into these rectangular slot openings, rectangular contact plugs are formed.

Overall, the present invention uses a non-oxygen element containing gas to etch a hard mask of a stacked film for forming desirable aperture patterns. According to a preferred embodiment of the present invention, the hard mask is preferably selected from an advanced pattern film (APF) fabricated by Applied Materials Inc., and the non-oxygen element gas is selected from a group consisting of $H_2$, $N_2$, He, $NH_3$, $CH_4$, and $C_2H_4$. As conventional method of using $CO/O_2/CO_2$ based etching gas typically causes issues such as side etch in the hard mask and aperture shrinkage, the present invention specifically uses non-oxygen element containing gas for conducting the etching process to maintain an adequate hard mask profile and critical dimension uniformity. Moreover, as critical dimension decreases, the approach of the present invention also maintains a consistent vertical profile of the aperture and prevent problem such as hole distortion.

Those skilled in the art will readily observe that numerous modifications and alterations of the device and method may be made while retaining the teachings of the invention.

What is claimed is:

1. A method for fabricating an aperture, comprising:
    forming a hard mask and a dielectric anti-reflective coating (DARC) on a semiconductor substrate;
    forming a first bottom anti-reflective coating (BARC) on the DARC;
    forming a first aperture in the first BARC and portion of the DARC without exposing the hard mask;
    forming a second BARC on the DARC and filling the first aperture;
    forming a second aperture in the second BARC and portion of the DARC, wherein the second BARC covering and filled in the first aperture is not removed during the formation of the second aperture, and both a bottom of the first aperture and a bottom of the second aperture are located at the same DARC; and
    using non-oxygen element containing gas to perform an etching process to transfer the first aperture and the second aperture to the hard mask for forming a plurality of third apertures.

2. The method of claim 1, wherein the hard mask comprises amorphous carbon.

3. The method of claim 1, wherein the non-oxygen element containing gas is selected from a group consisting of H2, N2, He, NH3, CH4, and C2H4.

4. The method of claim 1, further comprising forming a gate structure on the semiconductor substrate before forming the hard mask,
    wherein the gate structure comprises a contact etch stop layer and a dielectric layer thereon.

5. The method of claim 4, wherein the gate structure comprises a polysilicon gate or a metal gate.

6. The method of claim 1, wherein after forming the second aperture comprises:
    removing the portion of the DARC under the first aperture and the second aperture for exposing the hard mask; and
    using the remaining DARC to perform the etching process for forming the third apertures in the hard mask.

7. The method of claim 1, further comprising using the third apertures to define a rectangular slot opening along the horizontal axis of the gate structure.

8. A method for fabricating an aperture, comprising:
    forming a hard mask and a dielectric anti-reflective coating (DARC) on a semiconductor substrate;
    forming a first bottom anti-reflective coating (BARC) on the DARC;
    etching the first BARC, the DARC, and the hard mask for forming a first aperture in the hard mask;
    forming a second BARC on the DARC to fill the first aperture; and
    etching the second BARC, the DARC, and the hard mask to form a second aperture in the hard mask, wherein the second BARC covering and filled in the first aperture is not removed during the formation of the second aperture, the first aperture and the second aperture do not overlap each other, and both a bottom of the first aperture and a bottom of the second aperture are located at the same hard mask, and the step of etching the hard mask comprises using a non-oxygen element containing gas.

9. The method of claim 8, wherein the hard mask comprises amorphous carbon.

10. The method of claim 8, wherein the non-oxygen element containing gas is selected from a group consisting of H2, N2, He, NH3, CH4, and C2H4.

11. The method of claim 8, further comprising forming a gate structure on the semiconductor substrate before forming the hard mask, wherein the gate structure comprises a contact etch stop layer and a dielectric layer thereon.

12. The method of claim 11, wherein the gate structure comprises a polysilicon gate or a metal gate.

13. The method of claim 11, further comprising using the first aperture to define a rectangular slot opening along the horizontal axis of the gate structure.

14. The method of claim 8, wherein after forming the second aperture comprises using the remaining DARC to perform an etching process for forming a plurality of third apertures in the hard mask.

* * * * *